(12) United States Patent
Byun et al.

(10) Patent No.: US 11,487,348 B2
(45) Date of Patent: Nov. 1, 2022

(54) PIXEL CIRCUIT INCLUDING CONVERSION ELEMENT, CAPACITIVE ELEMENT, AND TRANSISTORS

(71) Applicant: Electronics and Telecommunications Research Institute, Daejeon (KR)

(72) Inventors: Chunwon Byun, Daejeon (KR); Young-deuk Jeon, Sejong-si (KR); Chi-Sun Hwang, Daejeon (KR); Chan-mo Kang, Daejeon (KR); Yun-Jeong Kim, Daejeon (KR); Hye Jin Kim, Daejeon (KR); Seongdeok Ahn, Daejeon (KR); Jeong Ik Lee, Daejeon (KR); Seong Hyun Kim, Daejeon (KR); Bock Soon Na, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 580 days.

(21) Appl. No.: 16/552,550

(22) Filed: Aug. 27, 2019

(65) Prior Publication Data

US 2020/0072665 A1 Mar. 5, 2020

(30) Foreign Application Priority Data

Aug. 28, 2018 (KR) .......................... 10-2018-0101460

(51) Int. Cl.
*G06F 3/01* (2006.01)
*G01J 1/46* (2006.01)
(Continued)

(52) U.S. Cl.
CPC .............. *G06F 3/01* (2013.01); *B25J 13/081* (2013.01); *G01J 1/46* (2013.01); *G01L 9/08* (2013.01);
(Continued)

(58) Field of Classification Search
CPC .. B25J 13/081; H01L 41/042; H01L 27/0629; H01L 27/146; H01L 27/14643;
(Continued)

(56) References Cited

U.S. PATENT DOCUMENTS 7,482,997 B2 1/2009 Yang et al.
9,728,149 B2 8/2017 Byun et al.
(Continued)

FOREIGN PATENT DOCUMENTS

KR 10-2007-0029856 A 3/2007
KR 20-2016-0001918 U 6/2016

OTHER PUBLICATIONS

Hiroshi Fuketa, et al., "1μm-Thickness 64-Channel Surface Electromyogram Measurement Sheet with 2V Organic Transistors for Prosthetic Hand Control", IEEE International Solid-State Circuits Conference, pp. 104-106, 2013.
(Continued)

*Primary Examiner* — Jennifer D Bennett
(74) *Attorney, Agent, or Firm* — Rabin & Berdo, P.C>

(57) ABSTRACT

Provided is a pixel circuit. The pixel circuit includes a conversion element forming a voltage of an input level at a first node, a first transistor adjusting the voltage of the first node to a first level in response to a first signal received at a first time interval, a first capacitive element forming a voltage at a second node based on the voltage of the first node, a second transistor adjusting a level of the voltage of the second node to a second level in response to the first signal, a third transistor forming a voltage at a third node, a fourth transistor outputting a current in response to a second signal received in a second time interval, and a. fifth transistor adjusting the voltage of the third node to a third level in response to a third signal received in a third time interval.

11 Claims, 9 Drawing Sheets

(51) Int. Cl.
  *B25J 13/08* (2006.01)
  *H03F 3/45* (2006.01)
  *G01L 9/08* (2006.01)
  *H01L 27/146* (2006.01)
  *H04N 5/369* (2011.01)

(52) U.S. Cl.
  CPC .... *H01L 27/14643* (2013.01); *H03F 3/45071* (2013.01); *H03F 2200/129* (2013.01); *H03F 2203/45116* (2013.01); *H04N 5/369* (2013.01)

(58) Field of Classification Search
  CPC .. H01L 41/113; G01L 9/08; G01J 1/46; G06F 3/01; H03F 3/45071; H03F 2200/129; H03F 2203/45116; H04N 5/369; H04N 5/378
  See application file for complete search history.

(56) References Cited

U.S. PATENT DOCUMENTS

| | | | | |
|---|---|---|---|---|
| 2009/0206851 A1* | 8/2009 | Chuang | ............ | G06V 40/1306 |
| | | | | 324/686 |
| 2016/0246422 A1* | 8/2016 | Tan | ............ | G09G 3/3233 |
| 2021/0366395 A1* | 11/2021 | Yang | ............ | G09G 3/3258 |

OTHER PUBLICATIONS

Takao Someya, et al., "Bionic Skins Using Flexible Organic Devices", IEEE 27th International Conference an MEMS, pp. 68-71, Jan. 26-30, 2014.

* cited by examiner

PIXEL CIRCUIT INCLUDING CONVERSION ELEMENT, CAPACITIVE ELEMENT, AND TRANSISTORS

CROSS-REFERENCE TO RELATED APPLICATIONS

This U.S. non-provisional patent application claims priority under 35 U.S.C. § 119 of Korean Patent Application No. 10-2018-0101460, filed on Aug. 28, 2018, the entire contents of which are hereby incorporated by reference.

BACKGROUND

The present disclosure herein relates to an electronic circuit, and more particularly, to a pixel circuit for configuring an active input array and an input device including the same.

With the development of IT devices, new input devices for inputting user's commands have been developed. For example, artificial skin has been studied as one of the input devices used in robot technology. In order to detect physical forces, artificial skin is designed to detect pressure.

When a pressure is externally applied by the piezoelectric effect, the piezoelectric element may generate a charge. For example, the piezoelectric element may be composed of materials such as crystal, piezoelectric ceramics, and polyvinylidene fluoride (PVDF). Artificial skin includes a pixel array with a plurality of piezoelectric elements for detecting pressure from the outside.

The pixel array includes a plurality of pixels for outputting current and voltage based on the pressure. In order to accurately detect the pressure externally applied, a design of a pixel that operates stably is required.

SUMMARY

The present disclosure is to provide a pixel circuit for outputting a current and a voltage based on energy converted by a conversion element and an input device including the same.

An embodiment of the inventive concept provides a pixel circuit including: a conversion element configured to form a voltage of an input level corresponding to a magnitude of a received energy at a first node; a first transistor configured to adjust the voltage of the first node to a first level in response to a first signal received at a first time interval; a first capacitive element configured to form a voltage at a second node based on the voltage of the first node; a second transistor configured to adjust a level of the voltage of the second node to a second level in response to the first signal; a third transistor configured to form a voltage at a third node, the voltage having a level corresponding to the level of the voltage of the second node; a fourth transistor configured to output a current corresponding to the voltage of the third node in response to a second signal received in a second time interval after the first time interval; and a fifth transistor configured to adjust the voltage of the third node to a third level in response to a third signal received in a third time interval after the second time interval.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
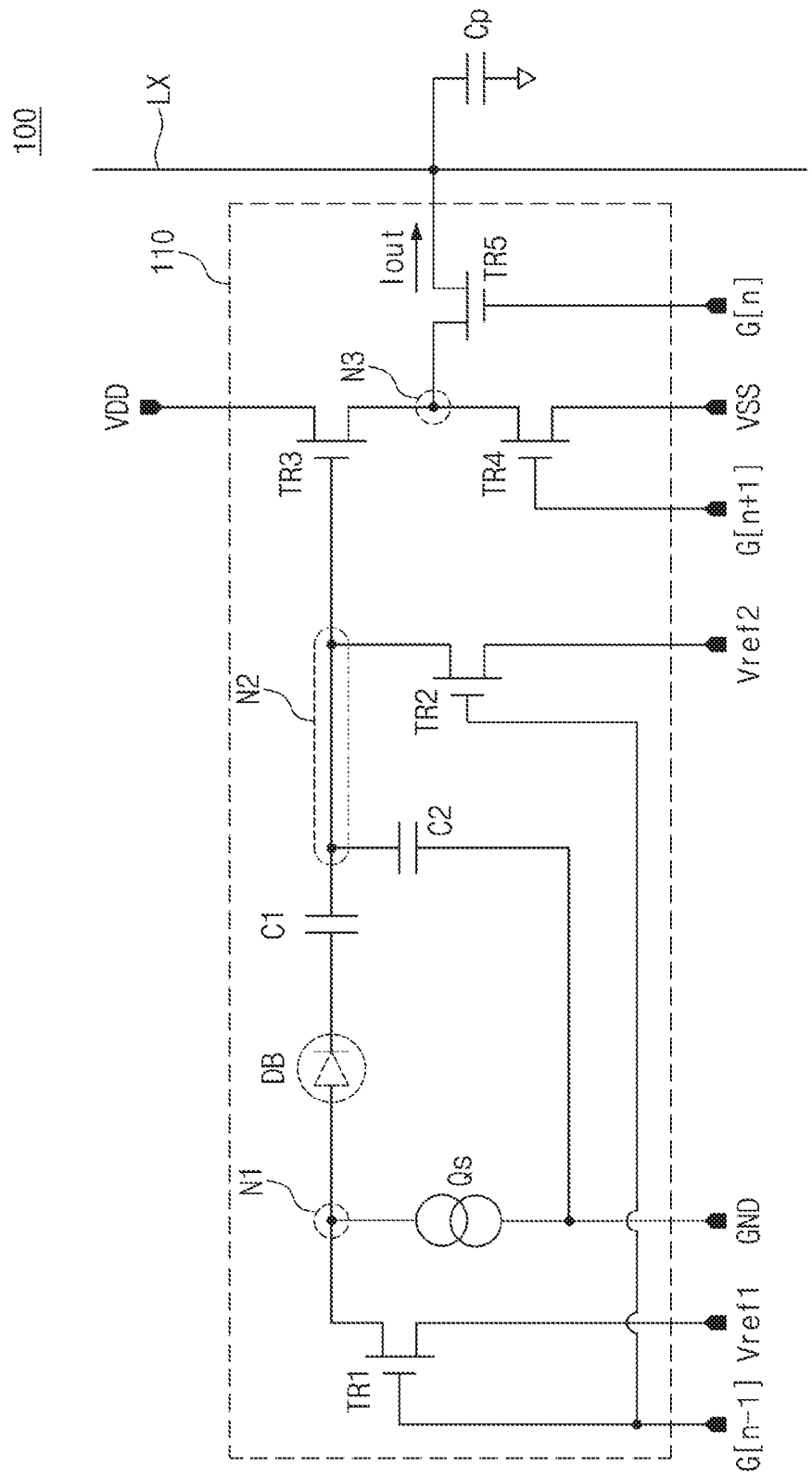
FIG. 1 is a circuit diagram showing a pixel circuit according to an embodiment of the inventive concept.

Hereinafter, embodiments of the inventive concept will be described in more detail with reference to the accompanying drawings. In the description below, details such as detailed configurations and structures are simply provided to help overall understanding. Therefore, without departing from the technical idea and scope of the inventive concept, modifications on embodiments described in this specification may be performed by those skilled in the art. Furthermore, descriptions of well-known functions and structures are omitted for clarity and conciseness. The terms used herein are defined in consideration of functions of the inventive concept and are not limited to specific functions. The definition of terms may be determined based on the details in description.

Circuits in drawings or detailed description below may be shown in the drawings or may be connected to another component other than components described in detailed description. Each of connections between circuits or components may be direct or indirect. Each of connections between circuits or components may be a connection by communication or a physical access.

Unless otherwise defined, all terms including technical or scientific meanings used in the specification have meanings understood by those skilled in the art. In general, the terms defined in the dictionary are interpreted to have the same meanings as contextual meanings and unless they are clearly defined in the specification, are not to be interpreted to have ideal or excessively formal meanings.

FIG. 1 is a circuit diagram showing a pixel circuit according to an embodiment of the inventive concept.

Referring to FIG. 1, an input device 100 may include a pixel circuit 110 and an output line LX. The pixel circuit 110 may include transistors TR1 to TR5, capacitive elements C1 to C2, and a piezoelectric element Qs. Referring to FIG. 1, a pixel circuit 110 including a diode DB will be described, but the pixel circuit 110 may or may not include a diode DB.

As an example, the diode (DB) may include at least one of a rectifier diode, a zener diode, and the like.

Alternatively, the diode DB may be implemented with at least one transistor. For example, if the diode is implemented with one transistor, the gate terminal of the transistor may be connected to one end of the transistor and the node N1. One end of the transistor may be connected to the node N1. The other end of the transistor may be connected to the capacitive element C1. As the current flows from the first node to the capacitive element C1 through the transistor, the voltage of the first node may be transferred to the capacitive element C1.

Hereinafter, pixel circuits including piezoelectric elements Qs will be described, but the piezoelectric elements Qs may be replaced with various energy conversion elements configured to generate charges based on physical energy. For example, the pixel circuit 110 may include at least one of a photoelectric conversion element and a thermoelectric conversion element instead of the piezoelectric element Qs.

Each of the transistors TR1 to TR5 may be implemented with at least one of various types of transistors. For example, each of the transistors TR1 to TR5 may be implemented with at least one among a BJT (Bipolar Junction Transistor), a JFET (Junction Field Effect Transistor), a MOSFET (Metal Oxide Semiconductor Field Effect Transistor), and a TFT (Thin Film Transistor).

Depending on the type of a conversion device, the use of the input device 100 may vary. As an example, the input device 100 including the piezoelectric elements Qs may convert the detected pressure into an electrical signal and may be used to implement a medium for detecting pressure, such as artificial skin. As an example, when the input device 100 includes a photoelectric conversion element, the input device 100 may convert the detected light into an electric signal, and may be used to implement a medium for detecting light such as an image sensor. The inventive concept is not limited to these examples, and the implementation of the conversion element and the input device 100 may be variously modified.

The signal G[n−1] may be received at the gate terminal of the transistor TR1. The voltage Vref1 may be received at one end of the transistor TR1. The other end of the transistor TR1 may be connected to the node N1. The piezoelectric element Qs may be connected between the node N1 and the supply end of the voltage GND. The voltage GND may have various levels for operation of the piezoelectric element Qs. As an example, the voltage GND may be a ground voltage. The diode DB may be connected between the node N1 and the capacitive element C1. The capacitive element C1 may be connected between the diode DB and the node N2. The capacitive element C2 may be connected between the node N2 and the supply end of the voltage GND.

The signal G[n−1] may be received at the gate terminal of the transistor TR2. The voltage Vref2 may be received at one end of the transistor TR2. The other end of the transistor TR2 may be connected to the node N2. The gate terminal of the transistor TR3 may be connected to the node N2. The voltage VDD may be received at one end of the transistor TR3. The other end of the transistor TR3 may be connected to the node N3. The signal G[n+1] may be received at the gate terminal of the transistor TR4. The voltage VSS may be received at one end of the transistor TR4. The other end of the transistor TR4 may be connected to the node N3. The signal G[n] may be received at the gate terminal of the transistor TR5. One end of the transistor TR5 may be connected to the node N3. The other end of the transistor TR5 may be connected to the output line LX.

Figure 8:
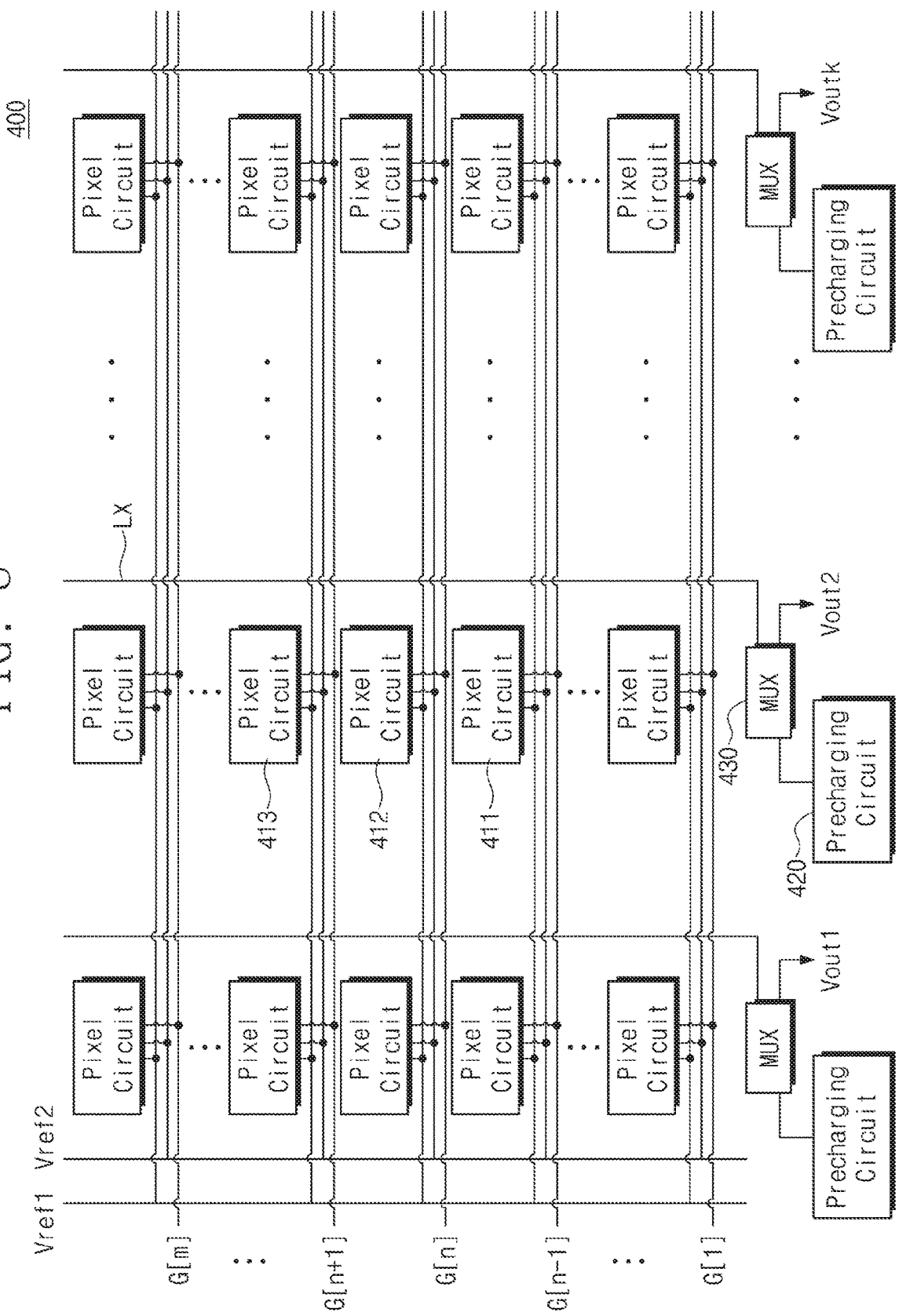
FIG. 8 is a block diagram illustrating a pixel array including at least one of the pixel circuit of FIG. 1, the pixel circuit of FIG. 3, the pixel circuit of FIG. 5, and the pixel circuit of FIG. 6.

FIG. 1 illustrates an input device 100 that includes one pixel circuit 110 but the input device 100 may include one or more pixel circuits connected to an output line LX. FIG. 1 shows only one output line LX, but the input device 100 may include a plurality of output lines to which one or more pixel circuits are connected. The pixel circuits connected to the output lines may form a pixel array. Referring to FIG. 8, the configuration of the pixel array will be described in more detail.

Figure 2:
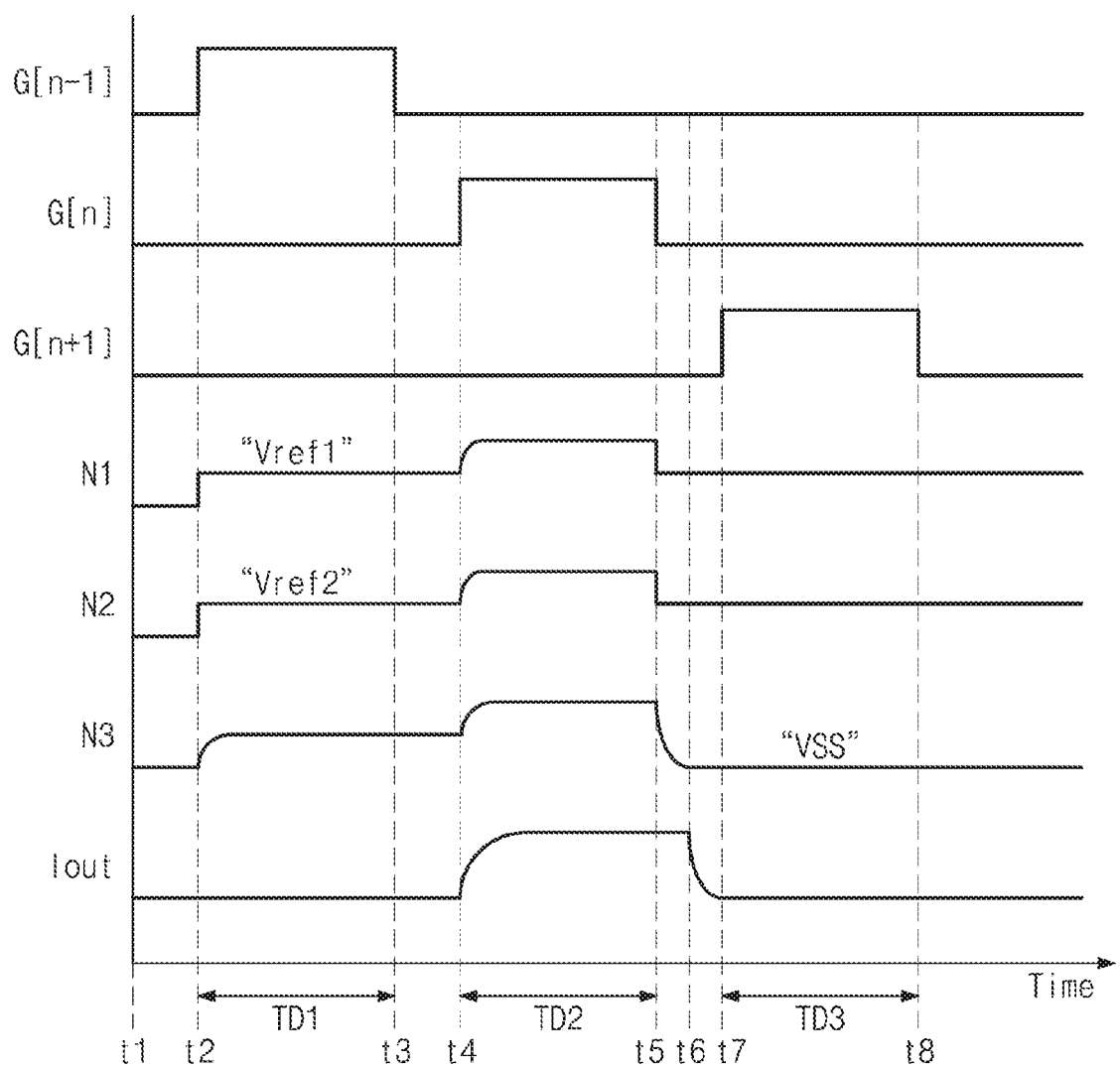
FIG. 2 is a timing diagram showing the levels of signals, voltages, and currents related to the operations of the pixel circuit of FIG. 1.

The signals G[n−1], G[n], and G [n+1] may be received from a controller outside the pixel circuit 110. As an example, the controller may periodically provide, to the pixel circuits, signals for controlling the pixel circuits connected to the output line LX. For example, the controller may sequentially and periodically provide signals G[n−1], G[n], and G [n+1] to control the pixel circuits including the pixel circuit 110. Referring to FIGS. 2 and 8, pixel circuits controlled by the signals G[n−1], G[n], and G[n+1] will be described in more detail.

The transistor TR1 may pass a current in response to the signal G[n−1]. As the current flows through the transistor TR1, a voltage corresponding to the voltage Vref1 may be formed at the node N1. For example, the level of the voltage formed at the node N1 by the transistor TR1 (hereinafter referred to as the voltage at the node N1) may be adjusted to a level corresponding to the level of the voltage Vref1.

The piezoelectric element Qs may generate the charge based on the pressure applied from the outside of the pixel circuit 110. For example, the amount of charge generated by the piezoelectric element Qs may correspond to the magnitude of the pressure applied to the piezoelectric element Qs. The charges generated by the piezoelectric element Qs may be transferred to the node N1. The level of the voltage of the node N1 may be changed by the charge transferred from the piezoelectric element Qs.

The diode DB may pass a current in one direction. As an example, the diode DB may pass a current from the node N1 to the capacitive element C1. As current flows through the diode DB, a voltage corresponding to the voltage at the node N1 may be formed at both ends of the capacitive element C1. For example, the diode DB may block the current flowing from the capacitive element C1 to the node N1. Therefore, the voltage formed at the node N2 by the diode DB (hereinafter referred to as the voltage at the node N2) may not affect the voltage at the node N1.

The capacitive element C1 may transfer the voltage at the node N1 to the node N2. For example, the capacitive element C1 may be charged by the current flowing through the diode DB. As the capacitive element C1 is charged, the voltage at the node N2 may be formed. Since the level of the current flowing through the diode DB corresponds to the level of the voltage at the node N1 and the level of the voltage formed at both ends of the capacitive element C1 corresponds to the level of the current flowing through the diode DB, the level of the voltage at the node N2 may correspond to the level of the voltage at the node N1. As the node N1 and the node N2 are connected through the capacitive element C1 without being directly connected to each other, the level of the voltage at the node N1 may be stably changed even if the level of the voltage at the node N2 changes abruptly.

The capacitive element C2 may be charged by the voltage at the node N2. Even if the level of the voltage transferred to the node N2 decreases by the capacitive element C1 and the diode DB, the level of the voltage at the node N2 may be maintained for a specific time period by the charge charged in the capacitive element C2. Thus, the level of the voltage at the node N2 may be stably maintained. For example, when the level of the voltage at the node N2 changes, the capacitive element C2 may decrease the change rate of the level of the voltage at the node N2.

The transistor TR2 may pass a current in response to the signal G[n−1]. As the current flows through the transistor TR2, the level of the voltage at the node N2 may be adjusted to a level corresponding to the level of the voltage Vref2. The transistor TR3 may pass a current in response to a varying level of the voltage at the node N2. As the current flows through the transistor TR3, a voltage may be formed at the node N3. The level of the voltage formed at the node N3 (hereinafter referred to as the voltage at the node N3) may correspond to the level of the voltage at the node N2.

The transistor TR3 may operate as a source follower. Thus, a voltage corresponding to the voltage at the node N2 may be formed at the node N3. That is, the level of the voltage at the node N3 may be adjusted according to the level of the voltage at the node N2. As an example, the transistor TR3 may pass a current in response to the voltage at the node N2. As the current flows through the transistor TR3, the level of the voltage at the node N3 may change. Since the level of the current flowing through the transistor TR3 corresponds to the level of the voltage at the node N2, the voltage at the node N3 may correspond to the level of the voltage at the node N2.

The transistor TR4 may operate to adjust the level of the voltage at the node N3 to a certain level in response to the signal G[n+1]. As an example, the transistor TR4 may pass a current in response to the signal G[n+1]. As the current flows through the transistor TR4, a voltage corresponding to the voltage VSS may be formed at the node N3. As an example, the level of the voltage at the node N3 may be adjusted to a level corresponding to the level of the voltage VSS.

The transistor TR5 may output the current Iout from the node N3 to the output line LX in response to the signal G[n]. Since the current Iout is generated based on the voltage at the node N3, the level of the current Iout may correspond to the level of the voltage formed at the node N3. The current Iout may be provided to the other electronic circuits through the output line LX as the output of the pixel circuit 110. For example, the current Iout may be provided as an input of an Analog to Digital Converter (ADC) included in the read-out circuit. The output line LX may have a parasitic capacitance. The parasitic capacitance may be modeled as a capacitive element Cp.

As described above, the level of the current Iout corresponds to the level of the voltage at the node N3 and the level of the voltage at the node N3 corresponds to the level of the voltage at the node N2. The level of the voltage at the node N2 corresponds to the level of the voltage at the node N1 and the level of the voltage at the node N1 corresponds to the amount of charge generated by the piezoelectric element Qs. The amount of charge generated by the piezoelectric element Qs may correspond to the magnitude of the pressure applied from the outside of the pixel circuit 110. Thus, the pixel circuit 110 may output a current Iout having a level related to the magnitude of the pressure externally applied. Thus, the current Iout may be used to generate digital data representing the magnitude of the pressure applied to the pixel circuit 110.

The pixel circuit 100 may receive voltages Vref1, Vref2, VDD, and VSS from an electronic circuit or the like located outside the pixel circuit 100. As an example, the pixel circuit 100 may receive the voltages Vref1, Vref2, VDD, and VSS from an electronic circuit such as a voltage generating circuit and a voltage regulator. The levels of the voltages Vref1, Vref2, VDD, and VSS may be determined in consideration of the characteristics of the transistors TR3 and TR5. As an example, the levels of the voltages Vref1, Vref2, and VDD may be determined such that transistor TR3 operates in the saturation region. As an example, the level of the voltage VSS may be determined such that the transistor TR5 operates in the saturation region.

FIG. 2 is a timing diagram showing the levels of signals, voltages, and currents related to the operations of the pixel circuit of FIG. 1. G[n−1], G[n], and G[n+1] in FIG. 2 correspond to the signals G[n−1], G[n], and G[n+1] in FIGS. 1. N1, N2, and N3 in FIG. 2 represent the voltage at the node N1, the voltage at the node N2, and the voltage at the node N3 in FIG. 1, respectively. Iout in FIG. 2 represents the current Iout in FIG. 1.

As described with reference to FIG. 1, one or more pixel circuits including the pixel circuit 110 may be connected to one output line LX. As an example, the pixel circuit 110 may be an n-th pixel circuit. The (n−2)-th pixel circuit, the (n−1)-th pixel circuit, the n-th pixel circuit, and the (n+1)-th pixel circuit may be sequentially connected to on the output line LX.

As described below, the n-th pixel circuit, that is, the pixel circuit 110, may output the current Iout in the time interval TD2 in response to the signal G[n]. By an operation similar to the operation of the pixel circuit 110 for the signal G[n], a current may be outputted from the (n−1)-th pixel circuit in the time interval TD1 in response to the signal G[n−1], and a current may be outputted from the (n+1)-th pixel circuit in the time interval TD3 in response to the signal G [n+1]. Although not shown in FIG. 2, a current may be outputted from the (n−2)-th pixel circuit in response to the signal G[n−2] before time point "t1".

In the example of FIG. 2, in order to prevent the current outputted from the (n−2)-th pixel circuit, the current outputted from the (n−1)-th pixel circuit, the current Iout outputted from the n-th pixel circuit, and the current outputted from the (n+1)-th pixel circuit from interfering with each other, a time interval between time point "t1" and time point "t2", a time interval between time point "t3" and time point "t4", and a time interval between time point "t5" and time point "t6" may be disposed. That is, as signals G[n−1], G[n], and G[n+1] are received so that time intervals occur between time intervals TD1, TD2, and TD3, the currents outputted from the pixel circuits may not interfere with each other.

At time point "t2", the signal G[n−1] may be received through the gate terminals of the transistor TR1 and the transistor TR2. In response to the signal G[n−1], currents may flow through the transistor TR1 and the transistor TR2. As current flows through the transistor TR1 and the transistor TR2, the level of the voltage at the node N1 and the level of the voltage at the node N2 may increase. For example, the increased level of the voltage at the node N1 may correspond to the level of the voltage Vref1, and the increased level of the voltage at the node N2 may correspond to the level of the voltage Vref2.

A current may flow through the transistor TR3 in response to the increased level of the voltage at the node N2. As the current flows through the transistor TR3 after time point "t2", the level of the voltage at the node N3 may be increased. As an example, the increased level of the voltage at the node N3 after time point "t2" may correspond to the increased level of the voltage at the node N2.

The signal G[n−1] may be received through the gate terminal of the transistor TR1 during the time interval TD1 from time point "t2" to time point "t3". Therefore, during the time interval TD1, the level of the voltage at the node N1 may be maintained at a level corresponding to the level of the voltage Vref1, and the level of the voltage at the node N2 may be maintained at a level corresponding to the level of the voltage Vref2. The level of the voltage at the node N3 may be increased to a level corresponding to the level of the voltage at the node N2, and then may be maintained. Also, a current may be outputted from the (n−1)-th pixel circuit in response to the signal G[n−1] in the time interval TD1.

At time point "t4", pressure may be applied from the outside of the pixel circuit 110 to the piezoelectric element Qs. The piezoelectric element Qs may generate the charge in response to the applied pressure. Due to the charge generated by the piezoelectric element Qs, the level of the voltage at the node N1 may increase. As the level of the voltage at the node N1 increases, the voltage at the node N2 and the voltage at the node N3 may increase.

The pressure applied to the piezoelectric element may be maintained during the time interval TD2 from time point "t4" to time point "t5". Thus, the increased level of the voltage at the node N1, the increased level of the node voltage N2, and the increased level of the voltage at the node N3 may be maintained until time point "t5". For a better understanding, while an embodiment of the pixel circuit 110 under pressure during the time interval TD2 is described, it will be understood well that the pressure may be applied to the pixel circuit 110 during any time interval from any time point.

At time point "t4", a signal G[n] may be received through the gate terminal of the transistor TR5. As the current Iout flows from the node N3 to the output line LX through the transistor TR5 in response to the signal G[n], the level of the current Iout may increase after time point "t4". The signal G[n] may be received through the gate terminal of the transistor TR5 during the time interval TD2 from time point "t4" to time point "t5". The level of the current Iout may be related to the magnitude of the pressure applied to the piezoelectric element Qs during the time interval TD2. As an example, after the level of the current Iout is increased to a level corresponding to the magnitude of the pressure applied to the piezoelectric element Qs during the time interval TD2, the increased level of the current Iout may be maintained.

At time point "t5", as the magnitude of the pressure applied to the piezoelectric element Qs decreases, the level of the voltage at the node N1, the level of the voltage at the node N2, and the level of the voltage at the node N3 may decrease. At time point "t5", as the level of the signal G[n] decreases, the current Iout flowing through the transistor TR5 may decrease. From time point "t5" to time point "t6", the level of the current Iout may be maintained due to the influence of the parasitic capacitance of the output line LX. That is, during the time interval from time point "t5" to time point "t6", the level of the current Iout may be maintained by the charge charged in the capacitive element Cp in FIG. 1. After time point "t6", the level of current Iout may decrease.

During the time interval TD3 from time point "t7" to time point "t8", the signal G[n+1] may be received through the gate terminal of the transistor TR4. A current may flow through the transistor TR4 in response to the signal G[n+1]. As the current flows through the transistor TR4, the level of the voltage at the node N3 may be adjusted. As an example, the level of the voltage at the node N3 may be adjusted to a level corresponding to the level of the voltage VSS. That is, the level of the voltage at the node N3 may initialize the level of the voltage at the node N3 to the level of the voltage VSS for the next operation of the pixel circuit 110.

Figure 3:
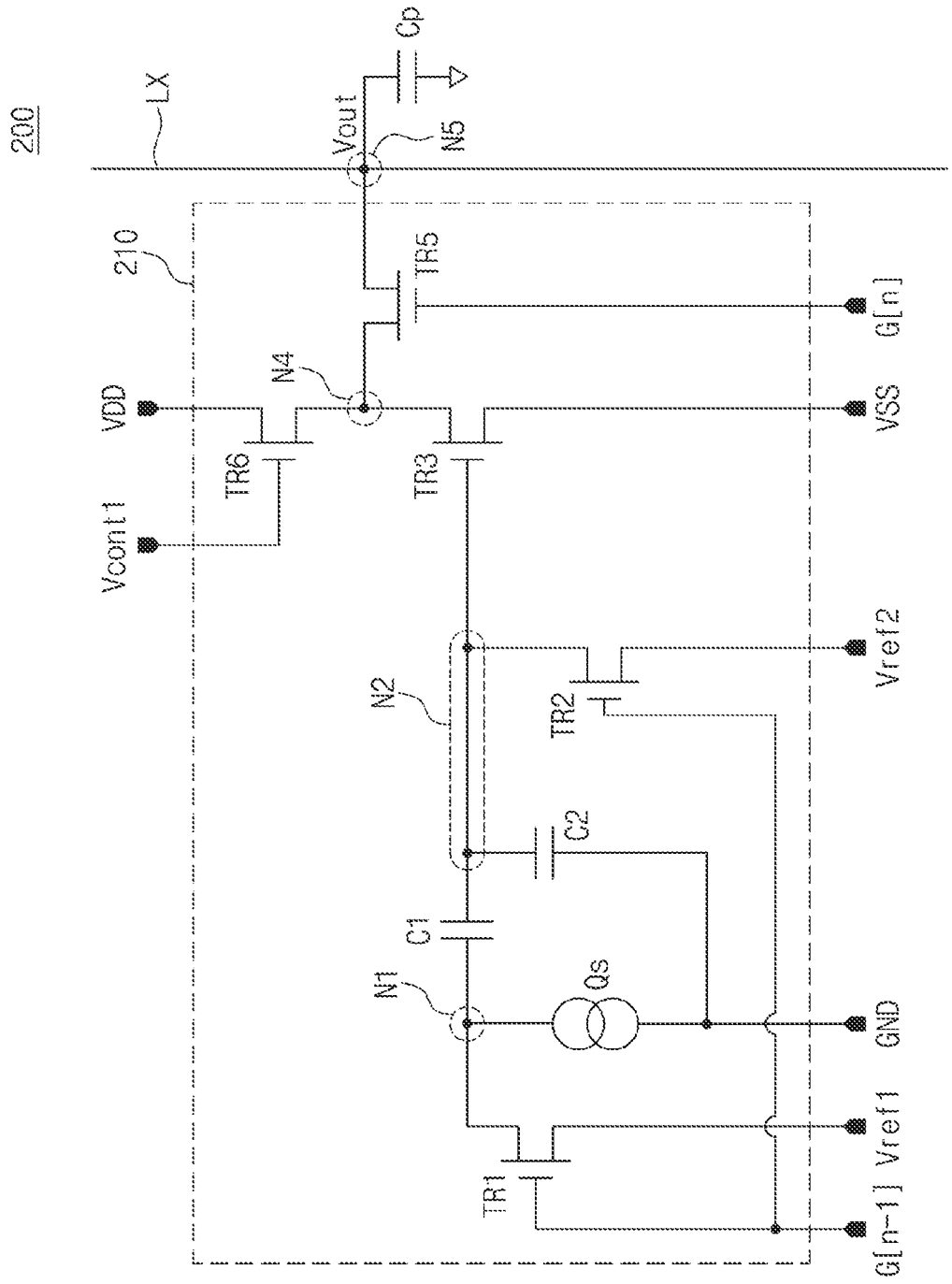
FIG. 3 is a circuit diagram showing a pixel circuit according to an embodiment of the inventive concept.

FIG. 3 is a circuit diagram showing a pixel circuit according to an embodiment of the inventive concept.

Referring to FIG. 3, an input device 200 may include a pixel circuit 210 and an output line LX. The pixel circuit 210 may include transistors TR1 to TR3, TR5, and TR6, capacitive elements C1 to C2, and a piezoelectric element Qs. Although not shown in FIG. 3, similar to that described with reference to the pixel circuit 110 of FIG. 1, the pixel circuit 210 may or may not include a diode connected between the node N1 and the capacitive element C1. Since the configuration and operation of a diode that may be included in the pixel circuit 210 are similar to those described with reference to the diode DB of FIG. 1, redundant descriptions are omitted below.

Since the configurations and operations of the piezoelectric element Qs, the transistors TR1 and TR2, and the capacitive elements C1 and C2 of FIG. 3 are similar to those of the piezoelectric element Qs, the transistors TR1 and TR2, and the capacitive elements C1 and C2 of FIG. 1, redundant descriptions are omitted below.

The gate terminal of the transistor TR3 may be connected to the node N2. One end of the transistor TR3 may be connected to the node N4. The voltage VSS may be received at the other end of the transistor TR3. The signal G[n] may be received at the gate terminal of the transistor TR5. One end of the transistor TR5 may be connected to the node N4. The other end of the transistor TR5 may be connected to the output line LX of the voltage Vout. The output line LX of the voltage Vout may be referred to as a node N5. The voltage Vcont1 may be received at the gate terminal of the transistor TR6. The voltage VDD may be received at one end of the transistor TR6. The other end of the transistor TR6 may be connected to the node N4. The level of the voltage VSS may be determined in consideration of the characteristics of the transistors TR3. As an example, the level of voltage VSS may be determined such that transistor TR3 operates in the saturation region. That is, the voltage VSS may be provided as an operating voltage for operating the transistor TR3.

FIG. 3 illustrates an input device 200 that includes a pixel circuit 210 but the input device 200 may include one or more pixel circuits connected to an output line LX. FIG. 3 shows only one output line LX, but the input device 200 may include a plurality of output lines to which one or more pixel circuits are connected. The pixel circuits connected to the output lines may form an array. Referring to FIG. 8, the configuration of the pixel array will be described in more detail.

Figure 4:
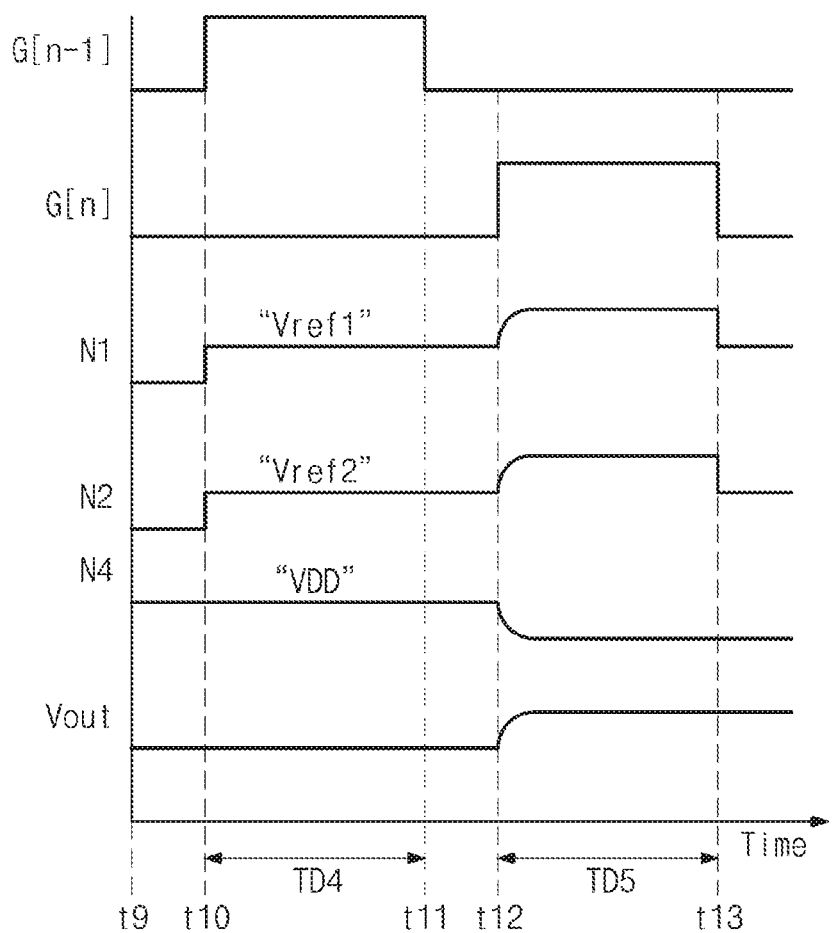
FIG. 4 is a timing diagram showing the levels of signals, voltages, and currents related to the operations of the pixel circuit of FIG. 3.

The signals G[n−1] and G[n] may be received from a controller outside the pixel circuit 210. As an example, the controller may provide, to the pixel circuits, signals for controlling the pixel circuits connected to the output line LX. For example, the controller may periodically and sequentially provide signals G[n−1] and G[n] to control the pixel circuits including the pixel circuit 210. Referring to FIG. 4, pixel circuits controlled by the signals G[n−1] and G[n] will be described in more detail.

The transistor TR3 may operate as a common source amplifier. Thus, a voltage corresponding to the voltage at the node N2 may be formed at the node N4. That is, the level of the voltage at the node N4 may be adjusted according to the level of the voltage at the node N2. As an example, the transistor TR3 may pass a current in response to the voltage at the node N2. As the current flows through the transistor TR3, the level of the voltage at the node N4 may decrease.

Since the level of the current flowing through the transistor TR3 corresponds to the level of the voltage at the node N2, the voltage at the node N4 may correspond to the level of the voltage at the node N2.

The voltage Vcont1 may be received at the gate terminal of the transistor TR6. The transistor TR6 may be turned on by the voltage Vcont1 to pass the current. The voltage Vcont1 may have a level for operating the transistor TR6. As an example, the voltage Vcont1 may have a level for operating the transistor TR6 in the saturation region. As the current flows through the transistor TR6, the voltage at the node N4 having a level corresponding to the level of the voltage VDD may be formed.

The transistor TR5 may output a voltage Vout corresponding to the voltage at the node N4 in response to the signal G[n]. The level of the voltage Vout may correspond to the level of the voltage at the node N4. The voltage Vout may be provided to the other electronic circuits through the output line LX as the output of the pixel circuit 210. As an example, the voltage Vout may be provided as an input to the ADC included in the read-out circuit. The output line LX may have a parasitic capacitance. The parasitic capacitance may be modeled as a capacitive element Cp.

As described above, the level of the voltage Vout corresponds to the level of the voltage at the node N4 and the level of the voltage at the node N4 corresponds to the level of the voltage at the node N2. The level of the voltage at the node N2 corresponds to the level of the voltage at the node N1 and the level of the voltage at the node N1 corresponds to the amount of charge generated by the piezoelectric element Qs. The amount of charge generated by the piezoelectric element Qs may correspond to the magnitude of the pressure applied from the outside of the pixel circuit 210. Thus, the pixel circuit 210 may output a voltage Vout having a level related to the magnitude of the pressure externally applied. Thus, the voltage Vout may be used to generate digital data representing the magnitude of the pressure applied to the pixel circuit 210.

FIG. 4 is a timing diagram showing the levels of signals and voltages related to the operations of the pixel circuit of FIG. 3. G[n−1] and G[n] in FIG. 2 correspond to the signals G[n−1] and G[n] in FIGS. 3. N1, N2, and N4 in FIG. 4 represent the voltage at the node N1, the voltage at the node N2, and the voltage at the node N4 in FIG. 3, respectively. Vout in FIG. 4 represents the voltage Vout in FIG. 3.

As described with reference to FIG. 3, one or more pixel circuits including the pixel circuit 210 may be connected to one output line LX. For example, the pixel circuit 210 may be the n-th pixel circuit. The (n−2)-th pixel circuit, the (n−1)-th pixel circuit, and the n-th pixel circuit may be sequentially connected to on the output line LX.

As described below, the n-th pixel circuit, that is, the pixel circuit 210, may output the current Vout in the time interval TD5 in response to the signal G[n]. By an operation similar to the operation of the pixel circuit 210 for the signal G[n], a voltage may be outputted from the (n−1)-th pixel circuit in response to G([n−1]) in the time interval TD4. Although not shown in FIG. 4, a current may be outputted from the (n−2)-th pixel circuit in response to the signal G[n−2] before time point "t9".

In the example of FIG. 4, in order to prevent the current outputted from the (n−2)-th pixel circuit, the current outputted from the (n−1)-th pixel circuit, and the current Iout outputted from the n-th pixel circuit from interfering with each other, a time interval between time point "t9" and time point "t10" and a time interval between time point "t12" and time point "t13" may be disposed. That is, as signals G[n−1], G[n], and G[n+1] are received so that time intervals occur between time intervals TD4 and TD5, the currents outputted from the pixel circuits may not interfere with each other.

At time point "t10", a signal G[n−1] may be received through the gate terminals of the transistor TR1 and the transistor TR2. In response to the signal G[n−1], currents may flow through the transistor TR1 and the transistor TR2. As current flows through the transistor TR1 and the transistor TR2, the level of the voltage at the node N1 and the level of the voltage at the node N2 may be adjusted. For example, the increased level of the voltage at the node N1 may correspond to the level of the voltage Vref1, and the increased level of the voltage at the node N2 may correspond to the level of the voltage Vref2.

The signal G[n−1] may be received through the gate terminal of the transistor TR1 during the time interval TD4 from time point "t10" to time point "t11". Therefore, during the time interval TD4, the level of the voltage at the node N1 may be maintained at a level corresponding to the level of the voltage Vref1, and the level of the voltage at the node N2 may be maintained at a level corresponding to the level of the voltage Vref2. Also, a voltage may be outputted from the (n−1)-th pixel circuit in response to the signal G[n−1] in the time interval TD4.

As the voltage Vcont1 is continuously received by the gate terminal of the transistor TR6 and the current flows through the transistor TR6, a voltage corresponding to the voltage VDD may be formed at the node N4. As an example, the level of the voltage at the node N4 may correspond to the level of the voltage VDD, Thus, during a time interval from time point "t9" to time point "t12", the voltage at the node N4 may be maintained at a voltage corresponding to the voltage VDD.

At time point "t12", pressure may be applied from the outside of the pixel circuit 210 to the piezoelectric element Qs. The piezoelectric element Qs may generate the charge in response to the applied pressure. Due to the charge generated by the piezoelectric element Qs, the level of the voltage at the node N1 may increase. As the level of the voltage at the node N1 increases, the level of the voltage at the node N2 may increase. A current may flow through the transistor TR3 in response to the increased level of the voltage at the node N2. As the current flows through the transistor TR3, the level of the voltage at the node N4 may decrease.

The pressure applied to the piezoelectric element may be maintained during the time interval TD5 from time point "t12" to time point "t13". Thus, the increased level of the voltage at the node N1, the increased level of the node voltage N2, and the decreased level of the voltage at the node N4 may be maintained until time point "t13". For convenience of explanation, while an embodiment of the pixel circuit 210 under pressure during the time interval TD5 is described, it will be understood well that the pressure may be applied to the pixel circuit 210 during any time interval from any time point.

During the time interval TD5 from time point "t12" to time point "t13", the signal G[n] may be received through the gate terminal of the transistor TR5. As the current flows through the transistor TR5 in response to the signal G[n], the level of the voltage Vout may increase after time point "t12". The level of the voltage Vout may be related to the magnitude of the pressure applied to the piezoelectric element Qs during the time interval TD5. As an example, after the level of the voltage Vout is increased to a level corresponding to the magnitude of the pressure applied to the piezoelectric element Qs during the time interval TD5, the increased level of the voltage Vout may be maintained.

Figure 5:
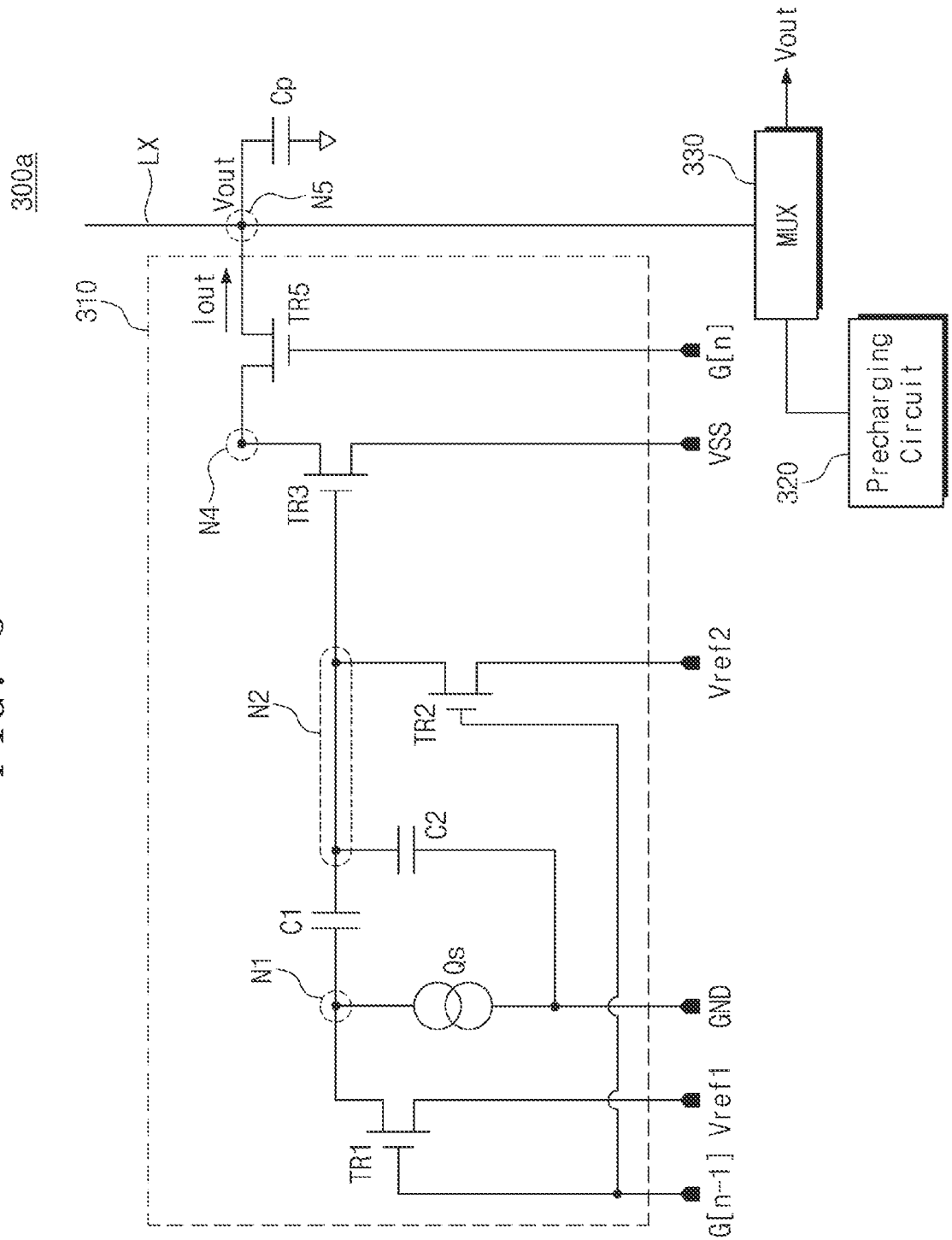
FIG. 5 is a circuit diagram showing a pixel circuit according to an embodiment of the inventive concept.

FIG. 5 is a circuit diagram showing a pixel circuit according to an embodiment of the inventive concept.

Referring to FIG. 5, the input device 300*a* may include a pixel circuit 310, a precharging circuit 320, a multiplexer (MUX) 330, and an output line LX. The precharging circuit 320 may be connected to the output line LX through the MUX 330. The precharging circuit 320 may adjust the level of the voltage Vout. The MUX 330 may connect the precharging circuit 320 and the output line LX or may output the voltage Vout received from the output line LX.

The pixel circuit 310 may include transistors TR1 to TR3 and TR5, capacitive elements C1 to C2, and a piezoelectric element Qs. Since the configurations and operations of the transistors TR1 to TR3 and TR5, the capacitive elements C1 to C2, and the piezoelectric element Qs are similar to those described with reference to FIG. 3, the description thereof is omitted.

Although not shown in FIG. 5, similar to that described with reference to the pixel circuit 110 of FIG. 1, the pixel circuit 310 may or may not include a diode connected between the node N1 and the capacitive element C1. Since the configuration and operation of a diode that may be included in the pixel circuit 310 are similar to those described with reference to the diode DB of FIG. 1, description thereof is omitted below.

Although not shown in FIG. 5, the pixel circuit 310 may further include an additional capacitive element connected between the gate terminal of the transistor TR3 and the supply terminal of the voltage VSS. The level of the voltage formed at the node N2 of the transistor TR3 may be stably maintained by the additional capacitive element. As an example, the additional capacitive element may be charged by the voltage at the node N2. Even if the level of the voltage transferred to the node N2 decreases by the capacitive element C1, the level of the voltage at the node N2 may be maintained for a specific time period by the charge charged in an additional capacitive element. Therefore, the level of the voltage at the node N2 may be maintained stably. For example, if the voltage at the node N2 changes, the additional capacitive element may reduce the change rate of the level of the voltage at the node N2.

Referring to FIG. 4 together with FIG. 5, during the time interval from time point "t11" to time point "t12", the precharging circuit 320 is connected to the output line LX by the MUX 330, and the precharging circuit 320 may adjust the level of the voltage Vout to a specific level. Thereafter, during the time interval TD5, the MUX 330 may output the voltage Vout received from the output line LX.

For example, The level of the voltage Vout may be changed by the (n−1)-th pixel circuit adjacent to the pixel circuit 310 in response to the signal G[n−1] in the time interval TD4. During the time interval from time point "t11" to time point "t12", the precharging circuit 320 may adjust the level of the voltage Vout changed by the (n−1)-th pixel circuit to a reference level. Thereafter, the level of the voltage Vout may again be changed by the pixel circuit 310.

The voltage Vout may be transferred to an electronic circuit such as a read-out circuit through the output line LX and the MUX 330. As an example, based on the difference between the level adjusted by the precharging circuit 320 and the level changed by the pixel circuit 310, the ADC may generate digital data corresponding to the magnitude of the pressure applied to the pixel circuit 310.

Figure 6:
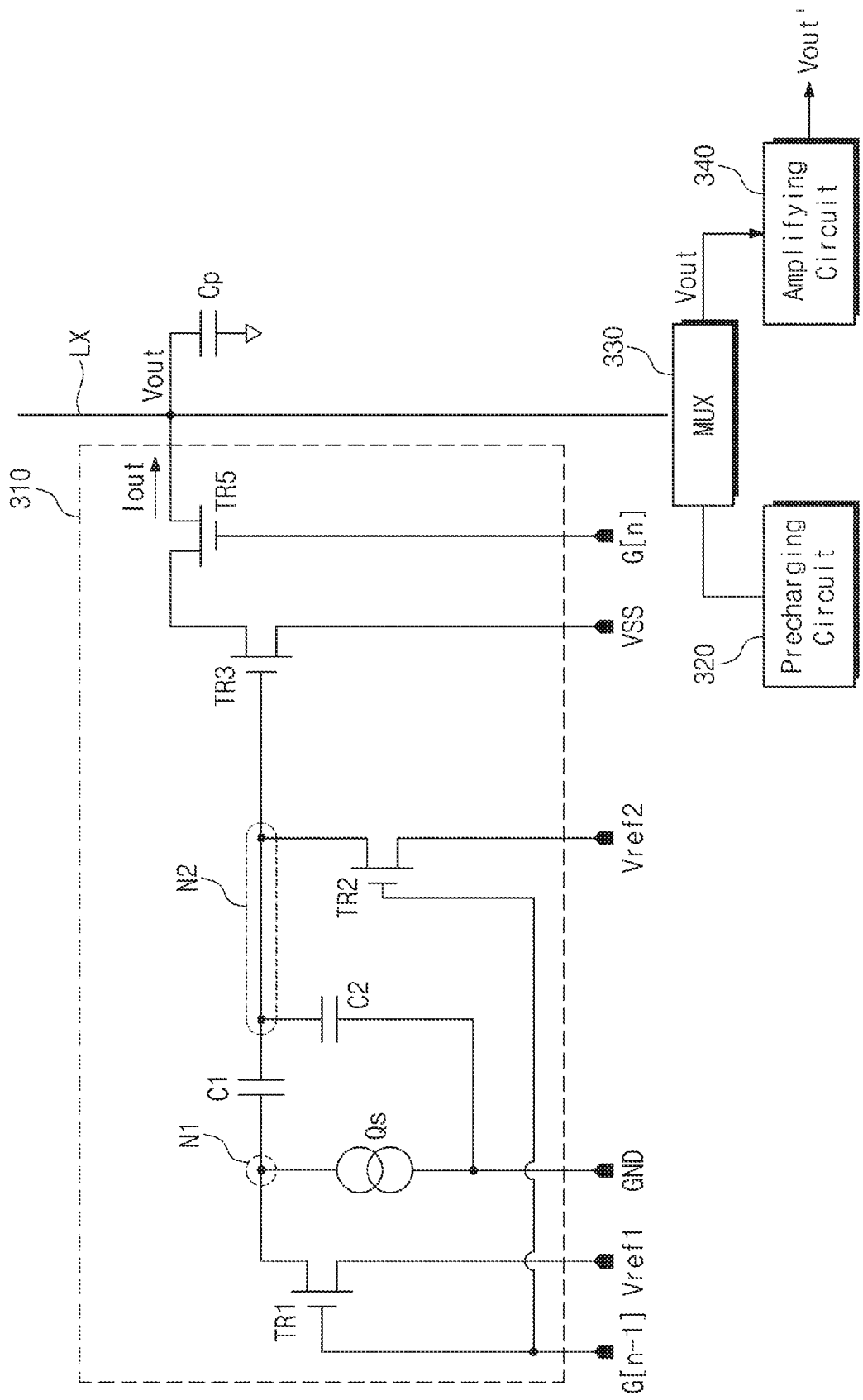
FIG. 6 is a circuit diagram showing a pixel circuit according to an embodiment of the inventive concept.

FIG. 6 is a circuit diagram showing a pixel circuit according to an embodiment of the inventive concept.

Referring to FIG. 6, the input device 300*b* may include a pixel circuit 310, a precharging circuit 320, an MUX 330, an amplifying circuit 340, and an output line LX. Since the configurations and operations of the pixel circuit 310, the precharging circuit 320, and the MUX 330 are similar to those described with reference to FIG. 5, redundant descriptions are omitted below.

The MUX 330 may selectively provide the voltage Vout to one of the precharging circuit 320 and the amplifying circuit 340. The amplifying circuit 340 may amplify the voltage Vout received from the MUX 330 and output the voltage Vout'. Since the level of the voltage Vout' is amplified based on the level of the voltage Vout, the level of the voltage Vout' may be related to the magnitude of the pressure applied to the pixel circuit 310.

The outputted voltage Vout' may be used by an electronic circuit such as a read-out circuit. Since the information represented by the voltage Vout' (for example, information relating to the magnitude of the pressure applied to the pixel circuit 310) is substantially equal to the information represented by the voltage Vout and the voltage Vout' has a level amplified from the level of the voltage Vout, the read-out circuit may efficiently obtain information based on the voltage Vout'.

Figure 7:
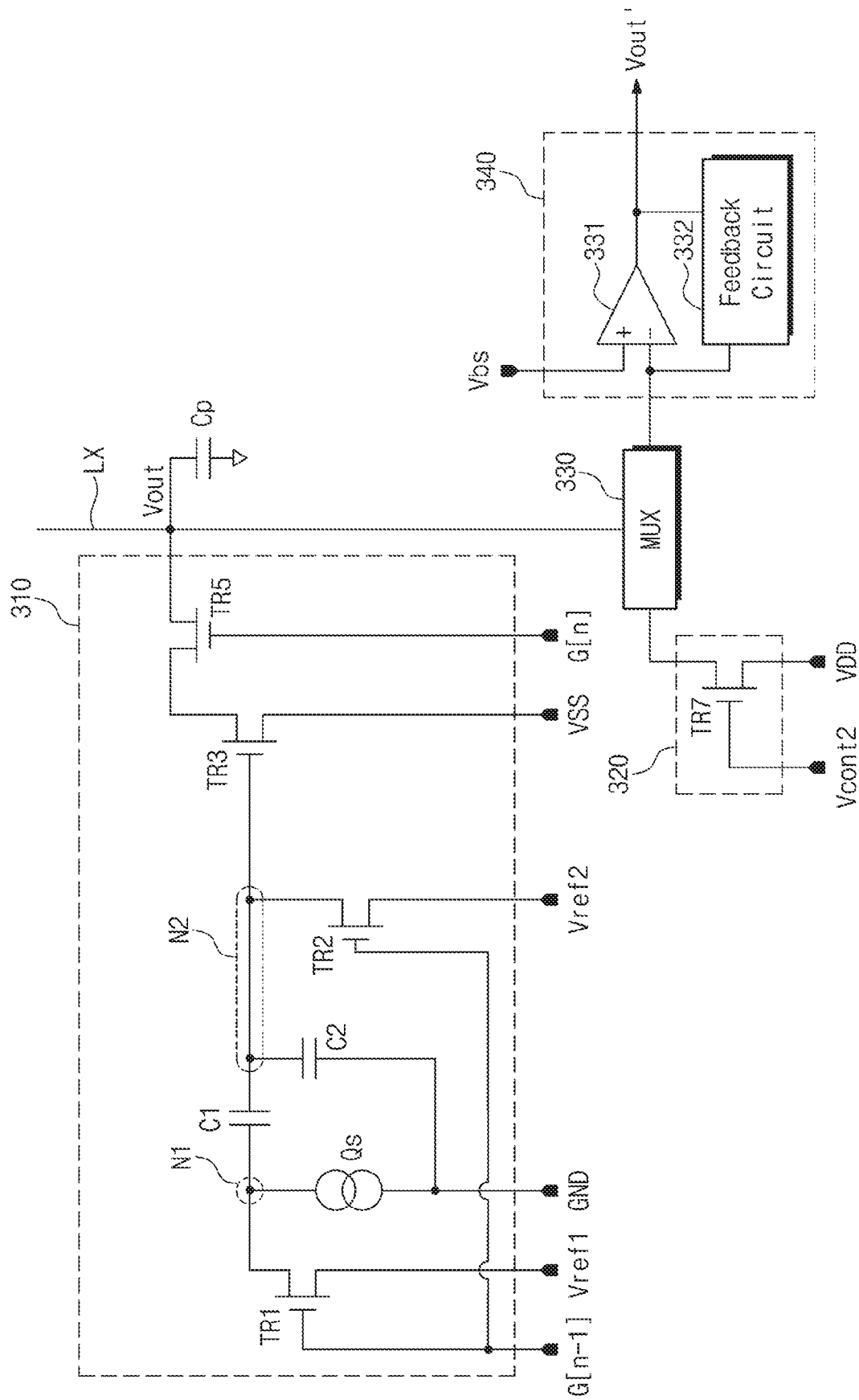
FIG. 7 is a circuit diagram showing a specific configuration of the precharging circuit and the amplifying circuit of FIG. 6.

FIG. 7 is a circuit diagram showing a specific configuration of the precharging circuit and the amplifying circuit of FIG. 6.

Referring to FIG. 7, the precharging circuit 320 may include a transistor TR7. The voltage Vcont2 may be received through the gate terminal of the transistor TR7. The voltage VDD may be received through one end of the transistor TR7. The other terminal of the transistor TR7 may be connected to the MUX 330.

When the transistor TR7 and the output line LX are connected through the MUX 320, the transistor TR7 may pass the current as turned on in response to the voltage Vcont2. For example, the transistor TR7 may receive the voltage Vcont2 from a voltage generator or the like outside the pixel circuit 300*b*. The voltage Vcont2 may have a level for operating the transistor TR7. As an example, the voltage Vcont2 may have a level for operating the transistor TR7 in the saturation region. As the current flows through the transistor TR7, the level of the voltage Vout may be adjusted to a level corresponding to the level of the voltage VDD.

The amplifying circuit 340 may include an operational amplifier 331 and a feedback circuit 332. The voltage Vbs may be received at the non-inverting terminal of the operational amplifier 331. For example, the operational amplifier 331 may receive a voltage Vbs from a voltage generator or the like outside the pixel circuit 300*b*. The inverting terminal of the operational amplifier 331 may be connected to the MUX 330 and the feedback circuit 332. The feedback circuit 332 may be connected between the inverting terminal and the output terminal of the operational amplifier 331.

The voltage Vbs may be a voltage for operating the operational amplifier 331. As an example, the level of the voltage Vout' may be determined based on the level of the voltage Vbs. The voltage Vout' is transferred to the read-out circuit and may be used in the read-out circuit. The read-out circuit may operate based on a voltage having a range of specific levels. The level of the voltage Vbs may be determined such that the level of the voltage Vout' is included in the range of the specific level required by the read-out circuit.

The feedback circuit 332 may provide a feedback path from the output terminal of the operational amplifier 331 to the inverting terminal of the operational amplifier 331. For example, the feedback circuit 332 may include at least one of one or more capacitors and one or more resistors. The gain of the amplifying circuit 340 may be determined based on the characteristics of the feedback circuit 332 and the gain of the operational amplifier 331. For example, the level of the voltage Vout' amplified by the amplifying circuit 340 may be a value obtained by multiplying the level of the voltage Vout by the gain of the amplifying circuit 340.

Comparing FIG. 7 with FIG. 3, the input device 300b may include a precharging circuit 320 located outside the pixel circuit 310, instead of the transistor TR6 included in the pixel circuit 210 of the input device 200. The pixel circuit 210 receives the voltage VDD through the transistor TR6 but the pixel circuit 310 may not receive the voltage VDD. Instead, the precharging circuit 320 may adjust the output voltage Vout based on the voltage VDD.

Thus, the power consumed by the pixel circuit 310 may be less than the power consumed by the pixel circuit 200. In addition, in the case of the input device 300b, since the precharging circuit 320 for adjusting the output voltage 300b based on the voltage VDD is located outside the pixel circuit 310, the user may easily adjust the voltage Vout of the output line LX and improve the performance of the input device 300b.

FIG. 8 is a block diagram illustrating a pixel array including at least one of the pixel circuit of FIG. 1, the pixel circuit of FIG. 3, the pixel circuit of FIG. 5, and the pixel circuit of FIG. 6.

The pixel array 400 may include m X k pixel circuits connected to k output lines. That is, the pixel array 400 includes k pixel circuits (pixel circuits in the first column) controlled by the signal G[1] to k pixel circuits (pixel circuits in the m-th column) controlled by the signal G[m]. As an example, the pixel array 400 may include pixel circuits 411 to 413 connected to the output line LX.

The pixel circuits in the first to m-th columns may receive signals G[1] to G[m], respectively, from the controller outside the pixel array 400. All the pixel circuits of the pixel array 400 may receive the voltage Vref1 and the voltage Vref2 from the supply line of the voltage Vref1 and the supply line of the voltage Vref2.

The pixel array 400 may include MUXs connected to the k output lines and precharging circuits connected to MUXs. As an example, the pixel array 400 may include an MUX 430 connected to the output line LX and a precharging circuit 420 connected to the MUX 430.

As described with reference to FIG. 2, in response to sequentially applied signals G[n−1], G[n], and G[n+1], currents and voltages may be outputted from the pixel circuits in the (n−1)-th column, the pixel circuits in the n-th column, and the pixel circuits in the (n+1)-th column, respectively. The outputted currents and voltages may be transferred to the MUXs through the output lines. As an example, the pixel circuits 411 to 413 may sequentially output currents and voltages to the output line LX in response to signals G[n−1], G[n], and G[n+1].

Figure 9:
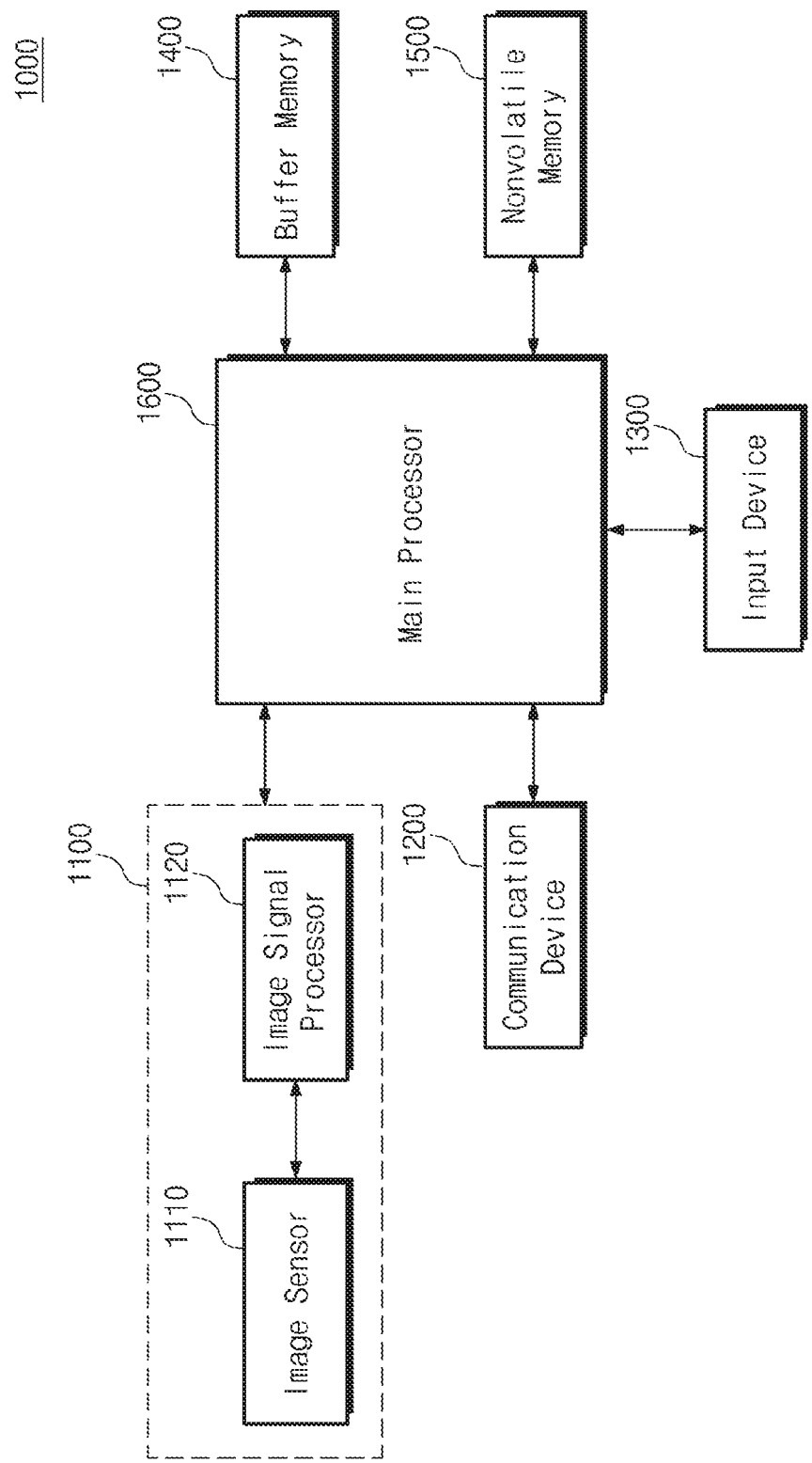
FIG. 9 is a block diagram illustrating an exemplary configuration of an electronic device including at least one of the input device of FIG. 1, the input device of FIG. 3, the input device of FIG. 5, and the input device of FIG. 6.

FIG. 9 is a block diagram illustrating an exemplary configuration of an electronic device including at least one of the input device of FIG. 1, the input device of FIG. 3, the input device of FIG. 5, and the input device of FIG. 6.

The electronic device 1000 may include an image processing block 1100, a communication device 1200, an input device 1300, a buffer memory 1400, a non-volatile memory 1500, and a main processor 1600. However, the components of the electronic device 1000 are not limited to the embodiment of FIG. 9. The electronic device 1000 may not include one or more of the components shown in FIG. 9, or may further include at least one component not shown in FIG. 9.

The image processing block 1100 may include an image sensor 1110 and an image signal processor 1120. The image processing block 1100 may receive light through the lens. The image sensor 1110 may include pixels for photoelectrically converting received light.

For example, the image sensor 1110 may include at least one of the pixel circuit 100 of FIG. 1, the pixel circuit 200 of FIG. 3, the pixel circuit 300a of FIG. 5, and the pixel circuit 300b of FIG. 6 to photoelectrically convert the received light. Each of the pixel circuit 100 of FIG. 1, the pixel circuit 200 of FIG. 3, the pixel circuit 300a of FIG. 5 and the pixel circuit 300b of FIG. 6 may include a photoelectric diode instead of the piezoelectric sensor Qs. The image signal processor 1120 may generate image information related to an object outside the electronic device 100 based on the digital data generated by the image sensor 1110.

The communication device 1200 may exchange signals with an external device/system. For example, the communication device 1200 may include an antenna, a transceiver, and a Modulator/Demodulator (MODEM). The communication device 1200 may process signals exchanged with an external device/system according to the wireless communication protocol such as Long Term Evolution (LTE), Worldwide Interoperability for Microwave Access (WIMAX), Global System for Mobile communication (GSM), Code Division Multiple Access (CDMA), Bluetooth, Near Field Communication (NFC), Wireless Fidelity (Wi-Fi), Radio Frequency Identification (RFID), and the like.

The input device 1300 may arbitrate communication between the user and the electronic device 1000. A user may input an instruction to the electronic device 1000 through the input device 1300. For example, the input device 1300 may detect the pressure applied by the user. The input device 1300 may generate digital data corresponding to the magnitude of the pressure applied by the user. The input device 1300 may transmit the generated digital data to the main processor 1600.

For example, the input device 1300 may include at least one of the input device 100 of FIG. 1, the input device 200 of FIG. 3, the input device 300a of FIG. 5, and the input device 300b of FIG. 6. In addition, the input device 1300 includes a controller for controlling the input device 100 of FIG. 1, the input device 200 of FIG. 3, the input device 300a of FIG. 5, and the input device 300b of FIG. 6. The controller may generate the signals G[n−1], G[n], and G[n+1] for controlling the input device 100 of FIG. 1, the input device 200 of FIG. 3, the input device 300a of FIG. 5, and the input device 300b of FIG. 6.

The buffer memory 1400 may store data used in the operation of the electronic device 1000. As an example, the buffer memory 1400 may temporarily store data that is processed or is to be processed by the main processor 1600. For example, the buffer memory 1400 may include volatile memory such as Static Random Access Memory (SRAM), Dynamic RAM (DRAM), Synchronous DRAM (SDRAM), and the like and/or non-volatile memory such as flash memory, Phase-change RAM (PRAM), Magneto-resistive RAM (MRAM), Resistive RAM (ReRAM), Ferro-electric RAM (FRAM), and the like.

The non-volatile memory 1500 may store data regardless of the power supply. For example, the storage device 1500 may include non-volatile memory such as flash memory, PRAM, MRAM, ReRAM, FRAM, and the like. For example, the non-volatile memory 1500 may include a removable memory such as a Hard Disk Drive (HDD), a Solid State Drive (SSD), a Secure Digital (SD) card, and/or an embedded memory such as Embedded Multimedia Card (eMMC).

The main processor 1600 may control the overall operations of the electronic device 1000. The main processor 1600 may control/manage the operations of the components of the electronic device 1000. The main processor 1600 may process various operations to operate the electronic device 1000. For example, the main processor 1600 may process various operations based on digital data by the image processing block 1100, the input device 1300 and the like. For example, the main processor 1600 may be implemented with at least one of a general purpose processor, a dedicated processor, or an application processor.

According to an embodiment of the inventive concept, the voltage and current related to the energy converted by the conversion element may be outputted stably from the pixel circuit and the input device.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. A pixel circuit comprising:
a conversion element configured to form a voltage of an input level at a first node, the input level corresponding to a magnitude of a received energy;
a first transistor configured to adjust the voltage of the first node to a first level in response to a first signal received in a first time interval;
a first capacitive element configured to form a voltage at a second node based on the voltage of the first node;
a second transistor configured to adjust a level of the voltage of the second node to a second level in response to the first signal;
a third transistor configured to form a voltage at a third node, the voltage of the third node having a level corresponding to the level of the voltage of the second node;
a fourth transistor configured to output a current corresponding to the voltage of the third node in response to a second signal, the second signal being received in a second time interval after the first time interval; and
a fifth transistor configured to adjust the voltage of the third node to a third level in response to a third signal, the third signal being received in a third time interval after the second time interval.

2. The pixel circuit of claim 1, further comprising a diode configured to:
transfer the voltage of the first node to the first capacitive element, and
block a voltage transferred from the second node to the first node through the first capacitive element.

3. The pixel circuit of claim 2, wherein the diode comprises a sixth transistor including a gate terminal connected to the first node and configured to transfer the voltage of the first node to the first capacitive element by passing a current from the first node to the first capacitive element.

4. The pixel circuit of claim 1, further comprising a second capacitive element configured to provide charges to the second node so as to reduce a change rate of the level of the voltage formed at the second node.

5. The pixel circuit of claim 1, wherein the conversion element is further configured to form the voltage of the input level at the first node based on a pressure applied to the conversion element, and
wherein each of the first transistor to the fifth transistor comprises a thin film transistor.

6. An input device comprising:
a first pixel circuit including:
a conversion element configured to form a voltage of a level corresponding to a magnitude of a received energy at a first node,
a first transistor configured to adjust a level of the voltage of the first node to a first level in response to a first signal, first signal being received in a first time interval,
a first capacitive element configured to transfer the voltage of the first node to a second node,
a second transistor configured to adjust a voltage of the second node to a second level in response to the first signal,
a third transistor configured to form a voltage corresponding to the voltage of the second node at a third node,
a fourth transistor configured to output a voltage corresponding to the voltage of the third node to a fourth node in response to a second signal received in a second time interval after the first time interval, and
a second capacitive element between the second node and a ground terminal; and
a precharging circuit configured to adjust a level of a voltage of the fourth node to a reference level.

7. The input device of claim 6, wherein the conversion element is connected between the first node and the ground terminal.

8. The input device of claim 6, further comprising a diode connected between the first node and the first capacitive element and configured to transfer the voltage of the first node to the first capacitive element.

9. The input device of claim 6, wherein the first pixel circuit further comprises a fifth transistor configured to adjust a level of the voltage of the third node to a third level.

10. The input device of claim 6, further comprising:
an amplifying circuit configured to amplify the voltage of the fourth node; and
a multiplexer configured to selectively provide the voltage of the fourth node to one of the precharging circuit and the amplifying circuit.

11. The input device of claim 10, wherein the amplifying circuit comprises:
an operational amplifier configured to amplify the voltage of the fourth node based on an operating voltage; and
a feedback circuit configured to feed back the voltage amplified by the operational amplifier to the fourth node.

* * * * *